US011965970B2

(12) United States Patent
Nishino

(10) Patent No.: US 11,965,970 B2
(45) Date of Patent: Apr. 23, 2024

(54) LIGHT RECEIVING ELEMENT AND RANGING SYSTEM

(71) Applicant: SONY SEMICONDUCTOR SOLUTIONS CORPORATION, Kanagawa (JP)

(72) Inventor: Tatsuki Nishino, Kanagawa (JP)

(73) Assignee: SONY SEMICONDUCTOR SOLUTIONS CORPORATION, Kanagawa (JP)

(*) Notice: Subject to any disclaimer, the term of this patent is extended or adjusted under 35 U.S.C. 154(b) by 524 days.

(21) Appl. No.: 17/250,672

(22) PCT Filed: Aug. 16, 2019

(86) PCT No.: PCT/JP2019/032125
§ 371 (c)(1),
(2) Date: Feb. 18, 2021

(87) PCT Pub. No.: WO2020/045125
PCT Pub. Date: Mar. 5, 2020

(65) Prior Publication Data
US 2022/0350027 A1 Nov. 3, 2022

(30) Foreign Application Priority Data
Aug. 31, 2018 (JP) ................. 2018-163586

(51) Int. Cl.
G01S 7/4863 (2020.01)
G01J 1/44 (2006.01)
(Continued)

(52) U.S. Cl.
CPC ............... *G01S 17/931* (2020.01); *G01J 1/44* (2013.01); *G01S 7/4863* (2013.01);
(Continued)

(58) Field of Classification Search
CPC .................. G01J 1/44; G01J 2001/442; G01J 2001/4466; G01J 2001/4473; G01S 7/4863
See application file for complete search history.

(56) References Cited

U.S. PATENT DOCUMENTS 9,935,618 B1 * 4/2018 Fenigstein ........... H03K 3/3565
9,952,323 B2 * 4/2018 Deane .................. G01S 7/4817
(Continued)

FOREIGN PATENT DOCUMENTS

CN 103780852 A 5/2014
CN 105988497 A 10/2016
(Continued)

OTHER PUBLICATIONS

International Search Report and Written Opinion of PCT Application No. PCT/JP2019/032125, dated Nov. 19, 2019, 09 pages of ISRWO.

Primary Examiner — Michelle M Iacoletti
Assistant Examiner — Kemaya Nguyen
(74) Attorney, Agent, or Firm — CHIP LAW GROUP

(57) ABSTRACT

A light receiving element and a ranging system is provided which achieve improvement of pixel characteristics while allowing variation in a breakdown voltage of an SPAD. The light receiving element includes a pixel array in which a plurality of pixels is arranged in a matrix, and a pixel driving unit configured to control respective pixels of the pixel array to be active pixels or non-active pixels. The pixel includes an SPAD, a transistor connected to the SPAD in series, an inverter configured to output a detection signal indicating incidence of a photon on the SPAD, a first transistor which is switched on or off in accordance with control of the pixels to be the active pixels or the non-active pixels, and a second transistor connected to the first transistor in series.

5 Claims, 13 Drawing Sheets

(51) Int. Cl.
  *G01S 17/931*  (2020.01)
  *H01L 31/107*  (2006.01)
(52) U.S. Cl.
  CPC ...... *H01L 31/107* (2013.01); *G01J 2001/442* (2013.01); *G01J 2001/4466* (2013.01); *G01J 2001/4473* (2013.01)

(56) References Cited

U.S. PATENT DOCUMENTS

| | | | |
|---|---|---|---|
| 10,114,129 B2* | 10/2018 | Yakimov | G01T 1/243 |
| 2006/0202129 A1* | 9/2006 | Niclass | G01S 17/894 |
| | | | 250/370.14 |
| 2014/0124652 A1 | 5/2014 | Dutton et al. | |
| 2015/0285625 A1 | 10/2015 | Deane | |
| 2016/0223397 A1 | 8/2016 | Tsai et al. | |
| 2016/0284743 A1 | 9/2016 | Mellot et al. | |

FOREIGN PATENT DOCUMENTS

| | | |
|---|---|---|
| CN | 106165399 A | 11/2016 |
| DE | 112015001704 T5 | 12/2016 |
| EP | 2728373 A1 | 5/2014 |
| JP | 2017-520134 A | 7/2017 |
| KR | 10-2016-0142839 A | 12/2016 |
| TW | 201627791 A | 8/2016 |
| WO | 2015/157341 A1 | 10/2015 |

\* cited by examiner

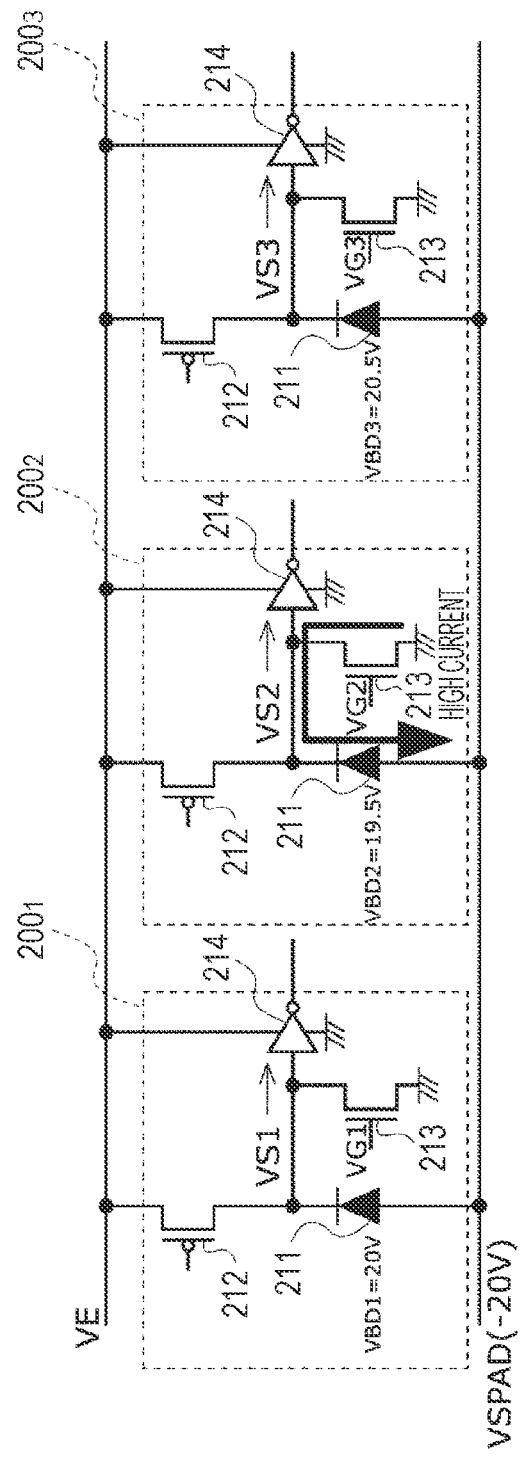

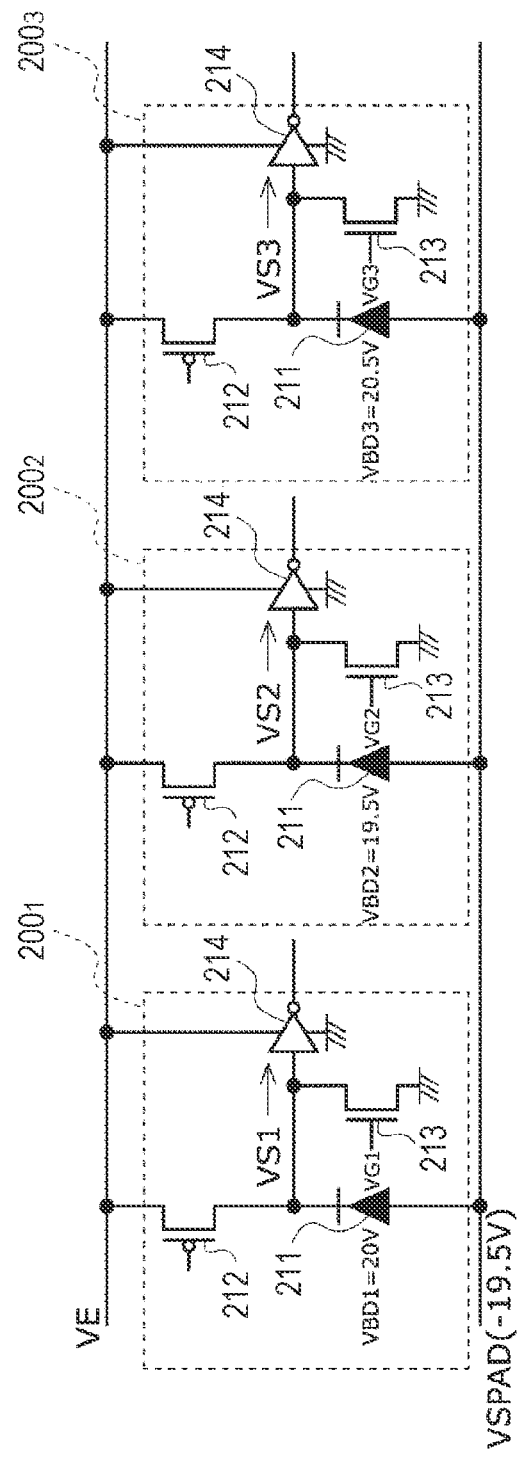

LIGHT RECEIVING ELEMENT AND RANGING SYSTEM

CROSS REFERENCE TO RELATED APPLICATIONS

This application is a U.S. National Phase of International Patent Application No. PCT/JP2019/032125 filed on Aug. 16, 2019, which claims priority benefit of Japanese Patent Application No. JP 2018-163586 filed in the Japan Patent Office on Aug. 31, 2018. Each of the above-referenced applications is hereby incorporated herein by reference in its entirety.

TECHNICAL FIELD

The present technology relates to a light receiving element and a ranging system, and more particularly, to a light receiving element and a ranging system which achieve improvement of pixel characteristics while allowing variation in a breakdown voltage of an SPAD.

BACKGROUND ART

In recent years, a range image sensor which measures a range using a time-of-flight (ToF) method has attracted attention. In the range image sensor, for example, a pixel array in which pixels using single photon avalanche diodes (SPADs) are arranged in a matrix is used. In the SPAD, avalanche amplification occurs if one photon enters a high-field PN junction region in a state where a voltage higher than a breakdown voltage is applied. A range can be measured with high accuracy by detecting a timing at which a current instantaneously flows upon occurrence of the avalanche amplification.

The range image sensor in which pixels using SPADs are arranged in a matrix is driven so that part of pixels are set as active pixels which detect photons, and the remaining pixels are set as non-active pixels which do not detect photons (for example, see Patent Document 1).

CITATION LIST

Patent Document

Patent Document 1: US 2016/0284743 A

SUMMARY OF THE INVENTION

Problems to be Solved by the Invention

Pixels set as non-active pixels are controlled so as not to react even if light is incident, by a voltage between an anode and a cathode of an SPAD being set at equal to or lower than a breakdown voltage. However, a phenomenon can occur such as, for example, flowing of a high current through non-active pixels due to variation in the breakdown voltage of the SPAD.

The present technology has been made in view of such circumstances and is directed to improving pixel characteristics while allowing variation in a breakdown voltage of an SPAD.

Solutions to Problems

A light receiving element according to the first aspect of the present technology includes a pixel array in which a plurality of pixels is arranged in a matrix, and a pixel driving unit configured to control respective pixels of the pixel array to be active pixels or non-active pixels, in which the pixel includes an SPAD, a resistance component connected to the SPAD in series, an output unit configured to output a detection signal indicating incidence of a photon on the SPAD, a first transistor which is switched on or off in accordance with control of the pixels to be the active pixels or the non-active pixels, and a second transistor connected to the first transistor in series.

A ranging system according to the second aspect of the present technology includes an illumination apparatus configured to radiate irradiation light, and a light receiving element configured to receive reflected light of the irradiation light, in which the light receiving element includes a pixel array in which a plurality of pixels is arranged in a matrix, and a pixel driving unit configured to control respective pixels of the pixel array to be active pixels or non-active pixels, and the pixel includes an SPAD, a resistance component connected to the SPAD in series, an output unit configured to output a detection signal indicating incidence of a photon on the SPAD, a first transistor which is switched on or off in accordance with control of the pixels to be the active pixels or the non-active pixels, and a second transistor connected to the first transistor in series.

According to the first and second aspects of the present technology, in the light receiving element, there are provided a pixel array in which a plurality of pixels is arranged in a matrix, and a pixel driving unit configured to control respective pixels of the pixel array to be active pixels or non-active pixels, and in the pixel, there are provided an SPAD, a resistance component connected to the SPAD in series, an output unit configured to output a detection signal indicating incidence of a photon on the SPAD, a first transistor which is switched on or off in accordance with control of the pixels to be the active pixels or the non-active pixels, and a second transistor connected to the first transistor in series.

The light receiving element and the ranging system may be independent apparatuses or may be modules to be incorporated into other apparatuses.

BRIEF DESCRIPTION OF DRAWINGS

FIG. 6 is a view for explaining a problem due to variation in a breakdown voltage VBD.

FIG. 7 is a view for explaining a problem due to variation in a breakdown voltage VBD.

MODE FOR CARRYING OUT THE INVENTION

Figure 1:
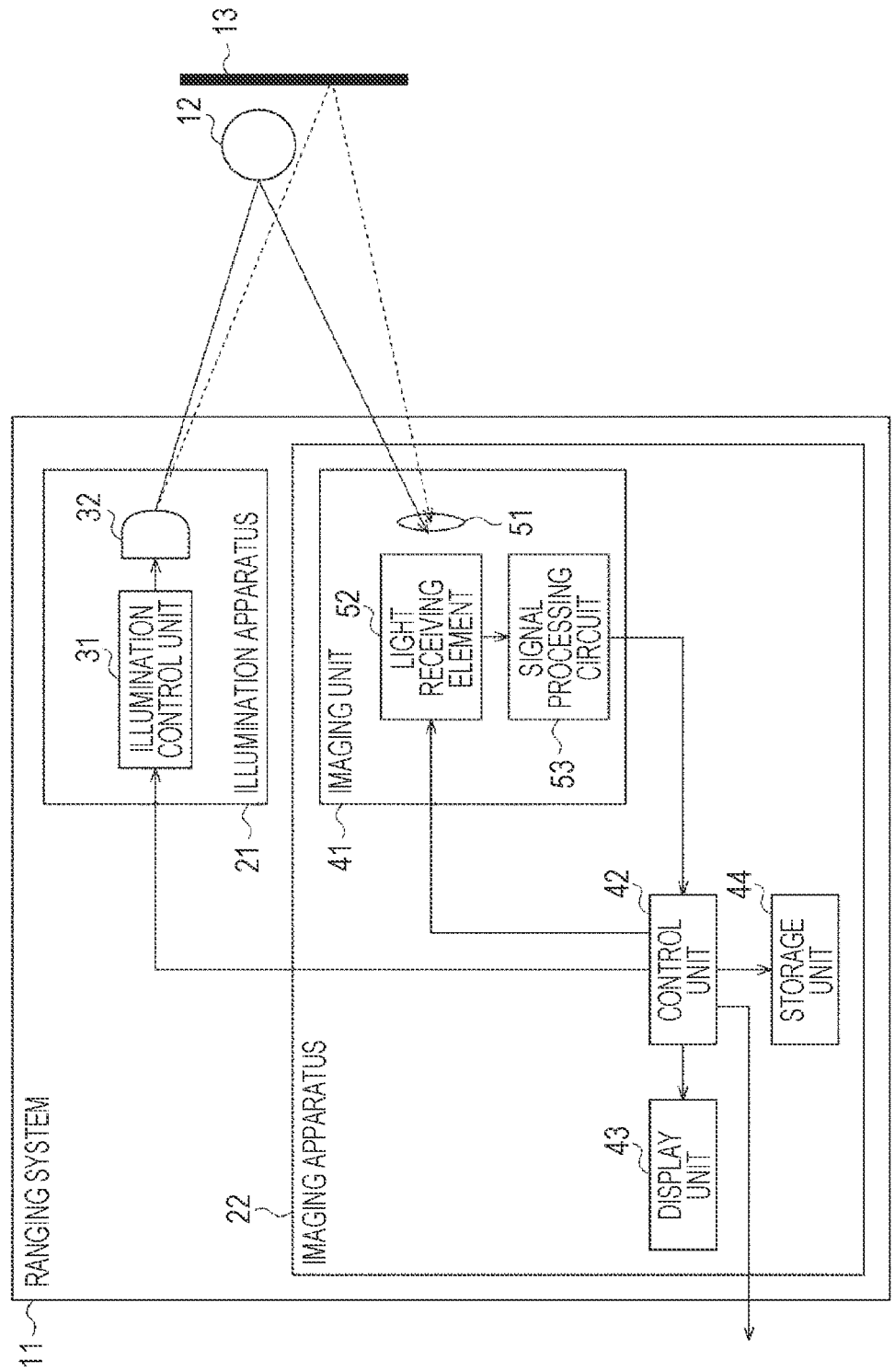
FIG. 1 is a block diagram illustrating a configuration example of an embodiment of a ranging system to which the present technology is applied.

Embodiments for implementing the present technology (hereinafter, referred to as embodiments) will be described below. Note that description will be provided in the following order.
1. Configuration example of ranging system
2. Configuration example of light receiving element
3. Configuration example of basic pixel circuit
4. Setting example of active pixels and non-active pixels
5. Problem due to variation in breakdown voltage VBD
6. Circuit configuration and operation of pixel
7. Use example of ranging system
8. Application example to mobile object <1. Configuration Example of Ranging System>

FIG. 1 is a block diagram illustrating a configuration example of an embodiment of a ranging system to which the present technology is applied.

A ranging system 11 is, for example, a system which captures a range image using a ToF method. Here, the range image is an image which is obtained by detecting a range in a depth direction from the ranging system 11 to a subject for each pixel and which includes range pixel signals based on the detected ranges.

The ranging system 11 includes an illumination apparatus 21 and an imaging apparatus 22.

The illumination apparatus 21 includes an illumination control unit 31 and a light source 32.

The illumination control unit 31 controls a light irradiation pattern by the light source 32 under control by a control unit 42 of the imaging apparatus 22. Specifically, the illumination control unit 31 controls the light irradiation pattern by the light source 32 in accordance with an irradiation code included in an irradiation signal supplied from the control unit 42. For example, the irradiation code is a binary code of 1 (high) and 0 (low), and the illumination control unit 31 turns on the light source 32 when a value of the irradiation code is 1 and turns off the light source 32 when the value of the irradiation code is 0.

The light source 32 emits light of a predetermined wavelength range under control by the illumination control unit 31. The light source 32 includes, for example, an infrared laser diode. Note that a type of the light source 32 and a wavelength range of irradiation light can be arbitrarily set in accordance with uses, and the like, of the ranging system 11.

The imaging apparatus 22 is an apparatus which receives reflected light which is light (irradiation light) radiated from the illumination apparatus 21 and reflected on a subject 12, a subject 13, and the like. The imaging apparatus 22 includes an imaging unit 41, the control unit 42, a display unit 43 and a storage unit 44.

The imaging unit 41 includes a lens 51, a light receiving element 52 and a signal processing circuit 53.

The lens 51 forms an image of incident light on a light receiving surface of the light receiving element 52. Note that the lens 51 has an arbitrary configuration, and, for example, the lens 51 may include a plurality of lenses.

The light receiving element 52 includes, for example, a sensor in which single photon avalanche diodes (SPADs) are used in respective pixels. The light receiving element 52 receives reflected light from the subject 12, the subject 13, and the like, under control by the control unit 42 and supplies a pixel signal obtained as a result to the signal processing circuit 53. This pixel signal represents a digital count value obtained by counting a time from when the illumination apparatus 21 radiates irradiation light until when the light receiving element 52 receives the light. A light emission timing signal indicating a timing for the light source 32 to emit light is also supplied from the control unit 42 to the light receiving element 52.

The signal processing circuit 53 performs processing on the pixel signal supplied from the light receiving element 52 under control by the control unit 42. For example, the signal processing circuit 53 detects a range to the subject for each pixel on the basis of the pixel signal supplied from the light receiving element 52 and generates a range image indicating the range to the subject for each pixel. Specifically, the signal processing circuit 53 acquires a time (count value) from when the light source 32 emits light until when each pixel of the light receiving element 52 receives light, for each pixel a plurality of times (for example, several thousands to several tens of thousands of times). The signal processing circuit 53 creates a histogram corresponding to the acquired time. The signal processing circuit 53 then determines a time it takes light radiated from the light source 32 to return after being reflected on the subject 12 or the subject 13 by detecting a peak of the histogram. The signal processing circuit 53 further performs computation of obtaining a range to an object on the basis of the determined time and speed of light. The signal processing circuit 53 supplies the generated range image to the control unit 42.

The control unit 42 includes, for example, a control circuit such as a field programmable gate array (FPGA) and a digital signal processor (DSP), a processor, and the like. The control unit 42 controls the illumination control unit 31 and the light receiving element 52. Specifically, the control unit 42 supplies an irradiation signal to the illumination control unit 31 and supplies a light emission timing signal to the light receiving element 52. The light source 32 emits irradiation light in accordance with the irradiation signal. The light emission timing signal may be the irradiation signal supplied to the illumination control unit 31. Further, the control unit 42 supplies the range image acquired from the imaging unit 41 to the display unit 43 and causes the range image to be displayed at the display unit 43. Still further, the control unit 42 causes the range image acquired from the imaging unit 41 to be stored in the storage unit 44. Further, the control unit 42 outputs the range image acquired from the imaging unit 41 to outside.

The display unit 43 includes, for example, a panel display apparatus such as a liquid crystal display apparatus and an organic electro luminescence (EL) display apparatus.

The storage unit 44 can include an arbitrary storage apparatus, storage medium, or the like, and stores the range image, and the like.

<2. Configuration Example of Light Receiving Element>

Figure 2:
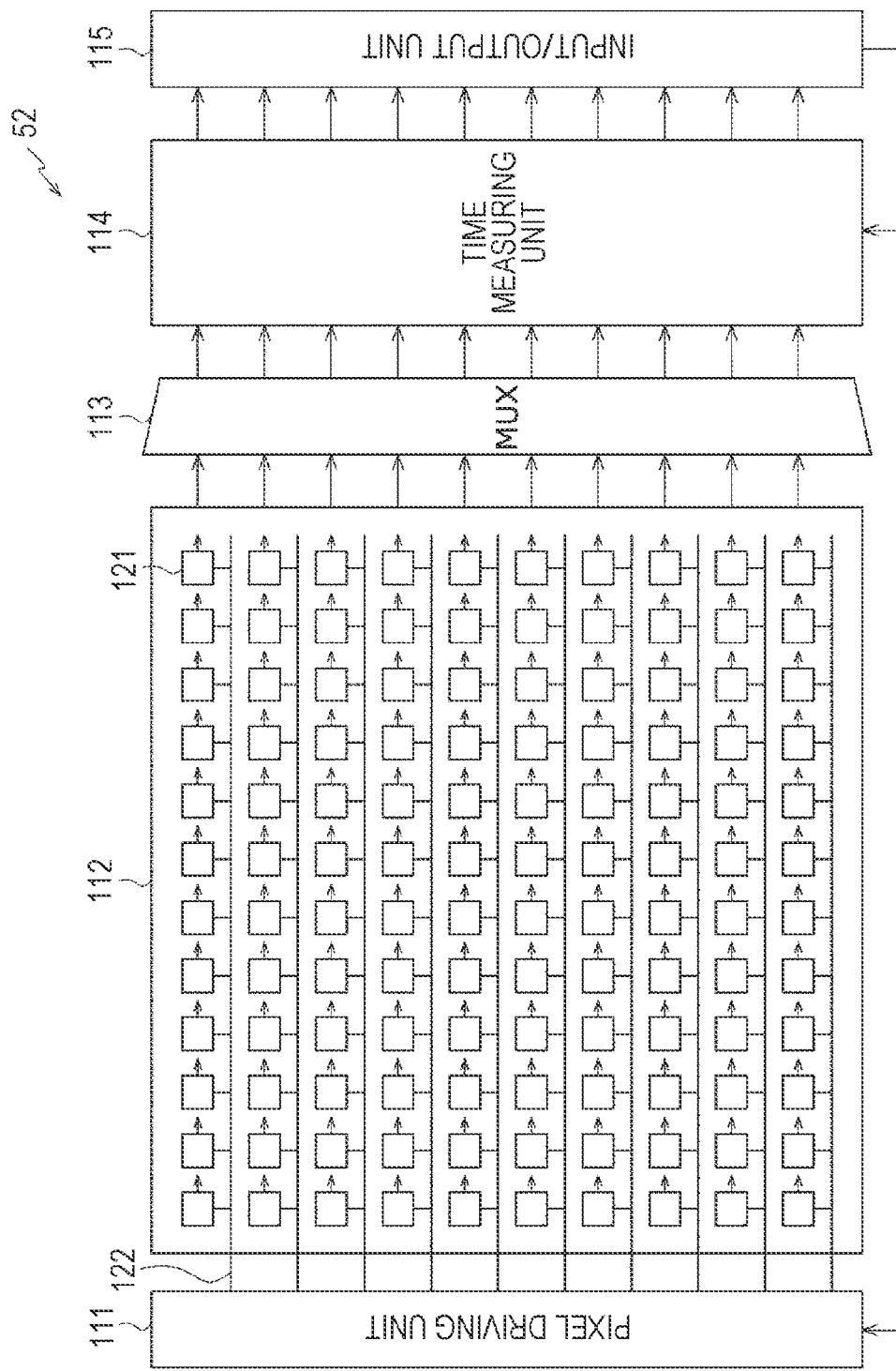
FIG. 2 is a block diagram illustrating a configuration example of a light receiving element in FIG. 1.

FIG. 2 is a block diagram illustrating a configuration example of the light receiving element 52.

The light receiving element 52 includes a pixel driving unit 111, a pixel array 112, a multiplexer (MUX) 113, a time measuring unit 114 and an input/output unit 115.

The pixel array 112 has a configuration in which pixels 121 which detect incidence of photons and output detection signals indicating detection results as pixel signals are arranged in two dimensions in a matrix in a row direction and in a column direction. Here, the row direction refers to an arrangement direction of the pixels 121 in a row of pixels, that is, a horizontal direction, and the column direction refers to an arrangement direction of the pixels 121 in a column of pixels, that is, a vertical direction. While FIG. 2 illustrates the pixel array 112 having a configuration of pixel arrangement of 10 rows and 12 columns due to space limitation, the number of rows and the number of columns of the pixel array 112 are not limited to these, and the pixel array 112 may have any number of rows and columns.

Pixel drive lines 122 are wired for each row of pixels along a horizontal direction on matrix pixel arrangement of the pixel array 112. The pixel drive line 122 transmits a drive signal for driving the pixel 121. The pixel driving unit 111 drives each pixel 121 by supplying a predetermined drive signal to each pixel 121 via the pixel drive line 122. Specifically, the pixel driving unit 111 performs control to set part of among a plurality of pixels 121 arranged in two dimensions in a matrix as active pixels and set the remaining as non-active pixels at a predetermined timing in accordance with a light emission timing signal supplied from outside via the input/output unit 115. The active pixels are pixels which detect incidence of photons, and the non-active pixels are pixels which do not detect incidence of photons. A detailed configuration of the pixel 121 will be described later.

Note that while FIG. 2 illustrates the pixel drive line 122 as one wiring, the pixel drive line 122 may include a plurality of wirings. One end of the pixel drive line 122 is connected to an output end corresponding to each row of pixels of the pixel driving unit 111.

The MUX 113 selects output from the active pixel in accordance with switching between the active pixel and the non-active pixel within the pixel array 112. The MUX 113 then outputs a pixel signal input from the selected active pixel to the time measuring unit 114.

The time measuring unit 114 generates a count value corresponding to a time from when the light source 32 emits light until when the active pixel receives light on the basis of the pixel signal of the active pixel supplied from the MUX 113 and the light emission timing signal indicating the light emission timing of the light source 32. The time measuring unit 114 may also be referred to as a time to digital converter (TDC). The light emission timing signal is supplied from outside (the control unit 42 of the imaging apparatus 22) via the input/output unit 115.

The input/output unit 115 outputs the count value of the active pixel supplied from the time measuring unit 114 to outside (the signal processing circuit 53) as the pixel signal. Further, the input/output unit 115 supplies the light emission timing signal supplied from the control unit 42 to the pixel driving unit 111 and the time measuring unit 114.

<3. Configuration Example of Basic Pixel Circuit>

Before a circuit configuration of the pixel 121 of the light receiving element 52 is described, a basic pixel circuit using an SPAD and operation will be described with reference to FIG. 3 and FIG. 4.

Figure 3:
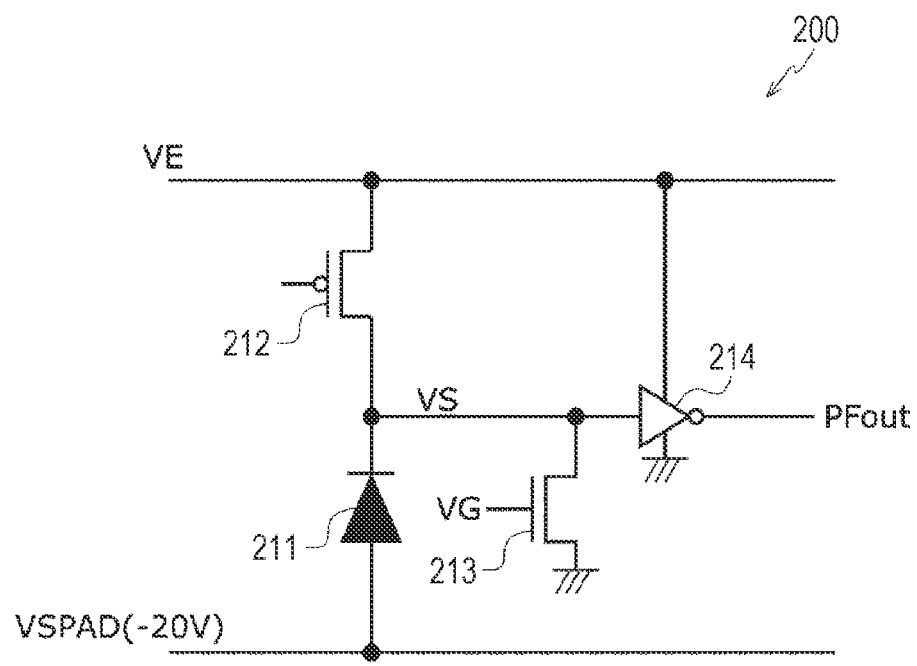
FIG. 3 is a view illustrating a basic pixel circuit using an SPAD.

FIG. 3 illustrates a basic pixel circuit using an SPAD.

A pixel 200 in FIG. 3 includes an SPAD 211, a transistor 212, a transistor 213 and an inverter 214. The transistor 212 includes a P-type MOS transistor, and the transistor 213 includes an N-type MOS transistor.

A cathode of the SPAD 211 is connected to a drain of the transistor 212 and is connected to an input terminal of the inverter 214 and a drain of the transistor 213. An anode of the SPAD 211 is connected to a power supply VSPAD.

The SPAD 211 is a photodiode (single photon avalanche photodiode) which avalanche amplifies a generated electron upon incidence of incident light to output a signal of a cathode voltage VS. The power supply VSPAD to be supplied to the anode of the SPAD 211 is, for example, set at a negative bias (negative potential) of −20 V.

The transistor 212 which is a constant current source which operates in a saturation region, performs passive quench by functioning as a quenching resistor. A source of the transistor 212 is connected to a power supply voltage VE, and a drain is connected to the cathode of the SPAD 211, the input terminal of the inverter 214, and the drain of the transistor 213. This allows the power supply voltage VE to be also supplied to the cathode of the SPAD 211. A pull-up resistor can be also used in place of the transistor 212 connected to the SPAD 211 in series.

A voltage (hereinafter referred to as an excess bias) higher than a breakdown voltage VBD of the SPAD 211 is applied to the SPAD 211 to detect light (photon) with sufficient efficiency. For example, assuming that the breakdown voltage VBD of the SPAD 211 is 20 V, and a voltage higher than the breakdown voltage VBD by 3 V is applied, the power supply voltage VE to be supplied to the source of the transistor 212 is set at 3 V.

A drain of the transistor 213 is connected to the cathode of the SPAD 211, the input terminal of the inverter 214 and the drain of the transistor 212, and a source of the transistor 213 is connected to ground (GND). A gating control signal VG is supplied to a gate of the transistor 213 from the pixel driving unit 111.

In a case where the pixel 200 is set as an active pixel, a Lo (Low) gating control signal VG is supplied to the gate of the transistor 213 from the pixel driving unit 111. Meanwhile, in a case where the pixel 200 is set as a non-active pixel, a Hi (High) gating control signal VG is supplied to the gate of the transistor 213 from the pixel driving unit 111.

The inverter 214 outputs a Hi detection signal PFout when the cathode voltage VS as an input signal is Lo, and outputs a Lo detection signal PFout when the cathode voltage VS is Hi. The inverter 214 is an output unit which outputs incidence of a photon on the SPAD 211 as a detection signal PFout.

Operation in a case where the pixel 200 is set as the active pixel will be described next with reference to FIG. 4. FIG. 4 is a graph indicating change of the cathode voltage VS of the SPAD 211 in accordance with incidence of a photon and the detection signal PFout.

First, in a case where the pixel 200 is an active pixel, the transistor 213 is switched off by the Lo gating control signal VG.

The power supply voltage VE (for example, 3 V) is supplied to the cathode of the SPAD 211, and the power supply VSPAD (for example, −20 V) is supplied to the anode, and a reverse voltage higher than the breakdown voltage VBD (=20 V) is thereby applied to the SPAD 211, so that the SPAD 211 is put into a Geiger mode. In this state, the cathode voltage VS of the SPAD 211 is the same as the power supply voltage VE, for example, as time t0 in FIG. 4.

If a photon is incident on the SPAD 211 which is put into the Geiger mode, avalanche multiplication occurs, and a current flows to the SPAD 211.

Figure 4:
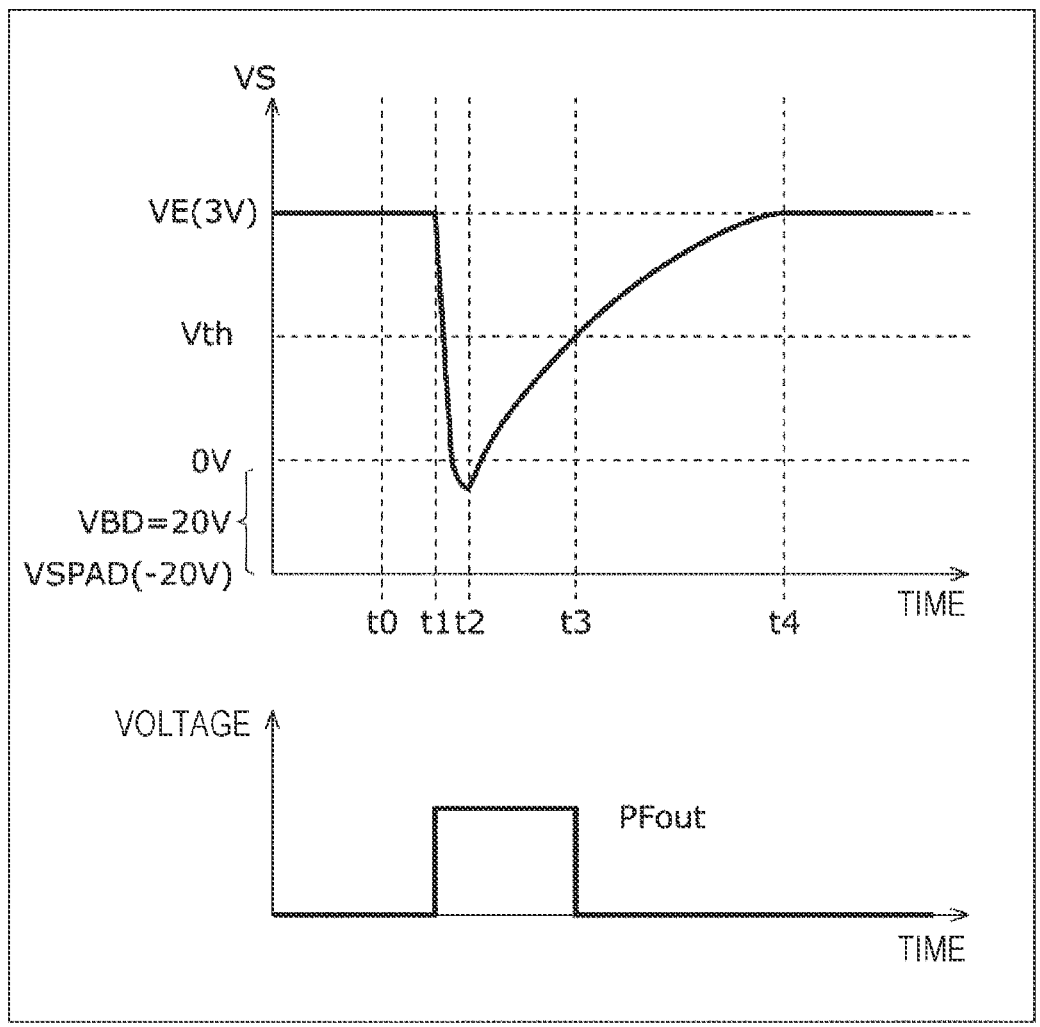
FIG. 4 is a view for explaining operation of a pixel in FIG. 3.

If avalanche multiplication occurs at time t1 in FIG. 4, and a current flows to the SPAD 211, at and after time t1, a current also flows to the transistor 212 by a current flowing to the SPAD 211, thereby voltage drop occurs by a resistance component of the transistor 212.

If the cathode voltage VS of the SPAD 211 becomes lower than 0 V at time t2, avalanche amplification stops because the voltage is lower than the breakdown voltage VBD. Here, operation of stopping avalanche amplification as a result of voltage drop being occurred by a current generated by the avalanche amplification flowing to the transistor 212, and the cathode voltage VS becoming lower than the breakdown voltage VBD in association with occurrence of the voltage drop, is quench operation.

If the avalanche amplification stops, a current flowing through the resistor of the transistor 212 gradually decreases, the cathode voltage VS returns to the original power supply voltage VE at time t4 again, and the pixel is put into a state where the pixel can detect a next new photon (recharge operation).

The inverter 214 outputs a Lo detection signal PFout in a case where the cathode voltage VS which is an input voltage is equal to or higher than a predetermined threshold voltage Vth and outputs a Hi detection signal PFout in a case where the cathode voltage VS is lower than the predetermined threshold voltage Vth. Thus, in a case where avalanche multiplication occurs by a photon being incident on the SPAD 211, and the cathode voltage VS decreases and falls below the threshold voltage Vth, the detection signal PFout is inverted from a low level to a high level. On the other hand, in a case where avalanche multiplication of the SPAD 211 converges, and the cathode voltage VS increases and becomes equal to or higher than the threshold voltage Vth, the detection signal PFout is inverted from a high level to a low level.

Note that in a case where the pixel 200 is set as a non-active pixel, a Hi gating control signal VG is supplied to the gate of the transistor 213 from the pixel driving unit 111 to switch on the transistor 213. This makes the cathode voltage VS of the SPAD 211 0 V (GND), and makes a voltage between the anode and the cathode of the SPAD 211 equal to or lower than the breakdown voltage VBD, so that the SPAD 211 does not react even if a photon is incident on the SPAD 211.

<4. Setting Example of Active Pixels and Non-Active Pixels>

Figure 5:
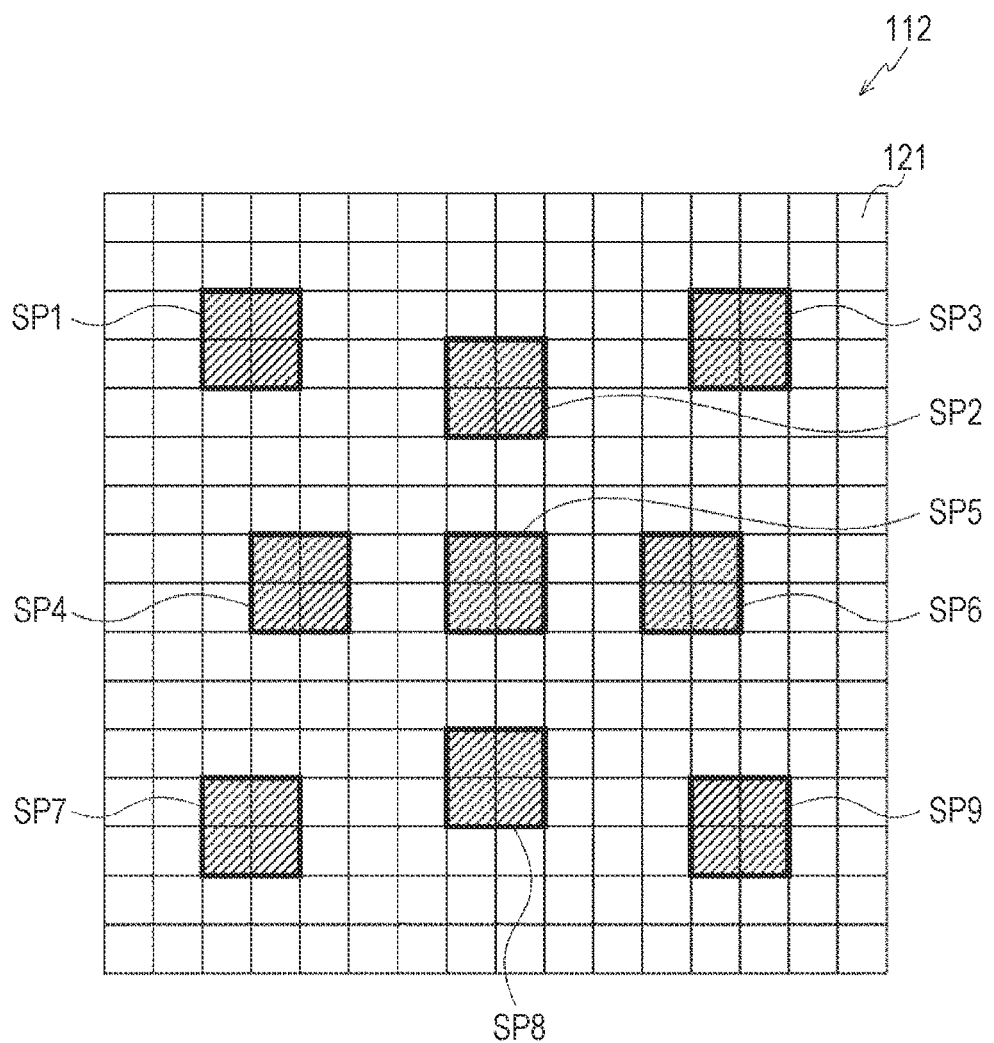
FIG. 5 is a view illustrating a setting example of active pixels and non-active pixels.

FIG. 5 illustrates a setting example of active pixels and non-active pixels for a plurality of pixels 121 of the pixel array 112.

The pixel array 112 in FIG. 5 includes 256 pixels 121 of 16 rows and 16 columns. Among 256 pixels 121, hatched pixels 121 represent active pixels, and the pixels 121 which are not hatched represent non-active pixels.

The pixel driving unit 111 selects a plurality of portions within the pixel array 112 in units of spot SP while, for example, assuming four pixels of 2×2 as one spot (cluster) SP and sets pixels in the selected portions as active pixels. In the example in FIG. 5, nine spots SP of spots SP1 to SP9 are selected and the pixels in the spots SP are set as active pixels. Note that the number of pixels included in a spot SP is not limited to four pixels of 2×2 illustrated in FIG. 5, and the number of pixels can be arbitrarily set such as, for example, two pixels of 2×1 and nine pixels of 3×3. Further, the pixel driving unit 111 keeps resolution of an area of ranging at equal to or higher than a predetermined value by moving the position of each spot SP within the pixel array 112 for each period.

By setting only part of pixels within the pixel array 112 as active pixels in this manner, it is possible to prevent a power supply from fluctuating as a result of an instantaneous operating current becoming too large and prevent the power supply fluctuation from affecting range accuracy. Additionally, spots are set as a target which is irradiated with laser light, and thus, by limiting the active pixels to part of spots SP in accordance with laser irradiation, it is possible to reduce power consumption.

<5. Problem Due to Variation in Breakdown Voltage VBD>

The power supply VSPAD to be supplied to the anode of the SPAD 211 is used in common among all the pixels 200 to simplify the circuit. As described above, if the breakdown voltage VBD of the SPAD 211 is 20 V, by setting the power supply VSPAD at, for example, −20 V, it is possible to make a voltage between the anode and the cathode of the SPAD 211 equal to or lower than the breakdown voltage VBD and prevent the SPAD 211 from reacting even if a photon is incident by switching on the transistor 213 using the Hi gating control signal VG in a case where the pixel 200 is set as a non-active pixel.

However, there is some variation in the breakdown voltage VBD of the SPAD 211. This variation of the breakdown voltage VBD may cause a situation as illustrated in FIG. 6.

FIG. 6 illustrates an example where the breakdown voltages VBD of the SPADs 211 of a plurality of pixels 200 vary.

FIG. 6 illustrates three pixels 2001 to 2003. A breakdown voltage VBD1 of the SPAD 211 of the pixel 2001 is 20 V, a breakdown voltage VBD2 of the SPAD 211 of the pixel 2002 is 19.5 V, and a breakdown voltage VBD3 of the SPAD 211 of the pixel 2003 is 20.5 V. Further, the power supply VSPAD to be supplied to the anode of the SPAD 211 is −20 V.

The cathode voltages VS1 to VS3 indicate voltages to be input to the inverter 214 in a case where the three pixels 2001 to 2003 are set as active pixels.

In a case where the three pixels 2001 to 2003 are set as non-active pixels, the transistor 213 is switched on and the cathode voltages VS1 to VS3 of the SPAD 211 are controlled to be 0 V (GND). The voltages between the anodes and the cathodes of the SPADs 211 become 20 V in the three pixels 2001 to 2003. The breakdown voltages VBD of the SPADs 211 of the pixel 2001 and the pixel 2003 are respectively 20 V and 20.5 V, and thus, the voltages between the anodes and the cathodes become equal to or lower than the breakdown voltages VBD. Thus, the SPADs 211 of the pixel 2001 and the pixel 2003 do not react even if a photon is incident. On the other hand, the breakdown voltage VBD of the SPAD 211 of the pixel 2002 is 19.5 V, and thus, the voltage between the anode and the cathode is still higher than the breakdown voltage VBD of the SPAD 211. Consequently, at the pixel 2002, in a case where a photon is incident, a high current flows via the transistor 213 as illustrated in FIG. 6.

To prevent a phenomenon at the pixel 2002 in FIG. 6, the power supply VSPAD may be set in accordance with the SPAD 211 having the lowest breakdown voltage VBD.

FIG. 7 illustrates an example where the power supply VSPAD is set at −19.5 V for three pixels 2001 to 2003 in FIG. 6.

By setting the power supply VSPAD at −19.5 in accordance with the breakdown voltage VBD2 (19.5 V) of the pixel 2002 whose breakdown voltage VBD is the lowest, the voltage between the anode and the cathode of the SPAD 211 in a case where the three pixels 2001 to 2003 are set as non-active pixels by the transistors 213 of the three pixels 2001 to 2003 being switched on becomes 19.5 V, which is equal to or lower than the breakdown voltages VBD of all the SPADs 211, so that the SPAD 211 does not react even if a photon is incident.

However, setting of the power supply VSPAD in accordance with the lowest breakdown voltage VBD as illustrated in FIG. 7 has a disadvantage of degrading pixel characteristics.

Figure 8A:
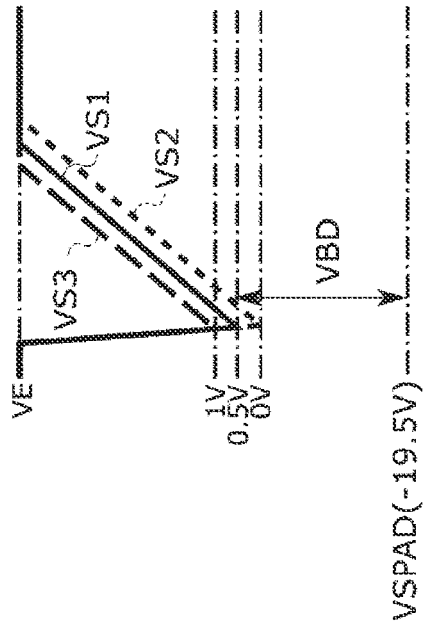
FIGS. 8A and 8B are views for explaining a problem due to variation in a breakdown voltage VBD.
Figure 8B:
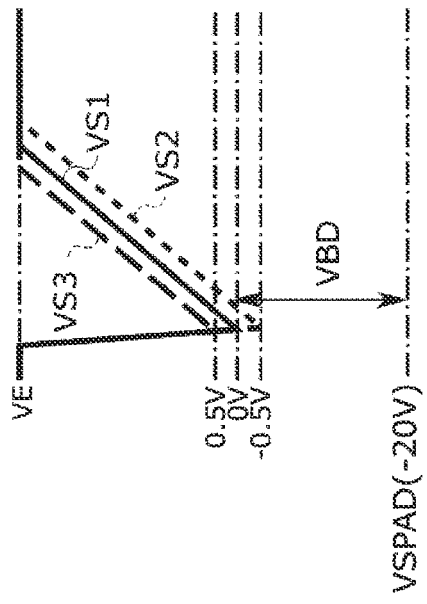

FIGS. 8A and 8B are views schematically illustrating change of the cathode voltage VS in a case where the three pixels 2001 to 2003 are set as active pixels, and photons are incident.

A of FIG. 8A is a graph indicating change of the cathode voltages VS1 to VS3 of the pixels 2001 to 2003 in FIG. 6 in a case where the power supply VSPAD is set at −20 V.

FIG. 8B is a graph indicating change of the cathode voltages VS1 to VS3 of the pixels 2001 to 2003 in FIG. 7 in a case where the power supply VSPAD is set at −19.5 V.

Pixel characteristics improve as an excess bias is greater. Here, the pixel characteristics are, for example, photon detection efficiency (PDE) representing a probability that one incident photon is detected.

Among the pixels 2001 to 2003 in FIG. 6 in a case where the power supply VSPAD is set at −20 V, as illustrated in FIG. 8A, also at the pixel 2003 having the highest breakdown voltage VBD=20.5 among the three pixels 2001 to 2003, the excess bias of 2.5 V=(VE−0.5) which is equal to or higher than the breakdown voltage VBD is secured.

In contrast, among the pixels 2001 to 2003 in FIG. 7 in a case where the power supply VSPAD is set at −19.5 V, as illustrated in FIG. 8B, the excess bias which is equal to or higher than the breakdown voltage VBD at the pixel 2003 having the highest breakdown voltage VBD=20.5 becomes low and 2.0 V=(VE−1.0).

In other words, the power supply VE is also used in common among all the pixels, and thus, setting of the power supply VSPAD in accordance with the SPAD 211 having the lowest breakdown voltage VBD substantially leads to lowering of the excess bias and triggers degradation of pixel characteristics.

Further, it is necessary to measure the breakdown voltages VBD of the SPADs 211 of all the pixels to set the power supply VSPAD in accordance with the SPAD 211 having the lowest breakdown voltage VBD, which involves an extremely large number of man-hours and is not realistic.

Thus, at the pixel 121 of the light receiving element 52, a circuit improved from the basic pixel circuit in FIG. 3 is mounted to solve the problems described with reference to FIGS. 6, 7, 8A, and 8B.

<6. Circuit Configuration and Operation of Pixel>

Figure 9:
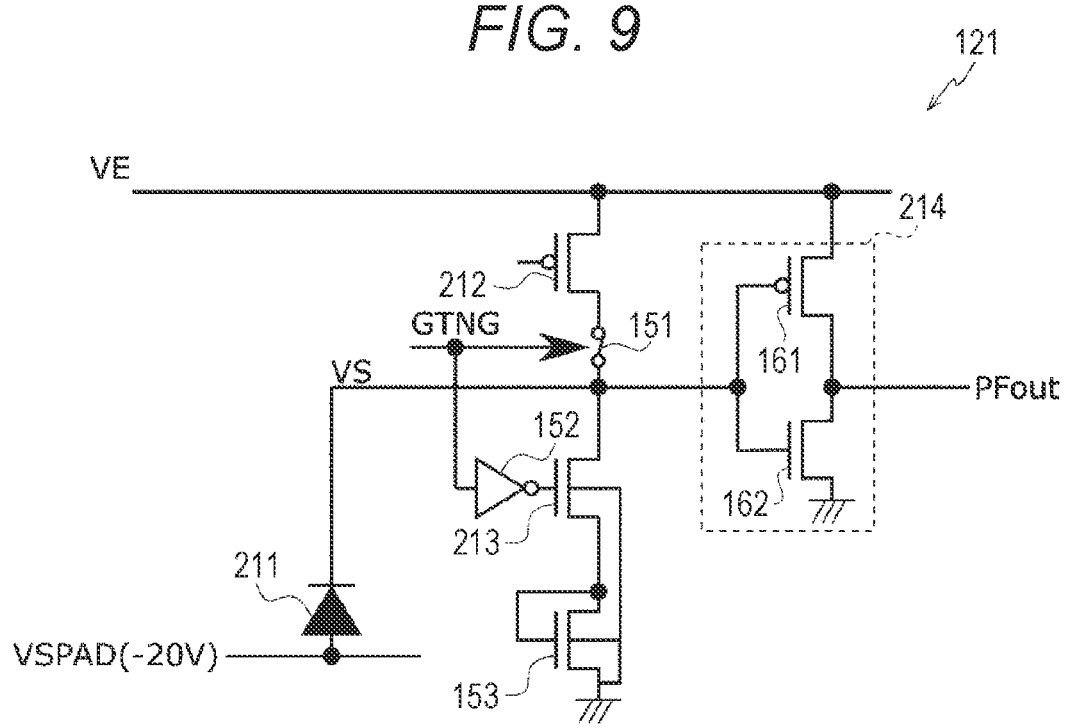
FIG. 9 is a view illustrating a circuit configuration of a pixel of the light receiving element in FIG. 1.

FIG. 9 illustrates a circuit configuration of the pixel 121 of the light receiving element 52.

In FIG. 9, the same reference numerals are assigned to portions corresponding to the portions of the basic pixel circuit in FIG. 4, and description of the portions will be omitted as appropriate.

The pixel 121 in FIG. 9 has a feature in common with the basic pixel circuit FIG. 4 in that the pixel 121 includes the SPAD 211, the transistor 212, the transistor 213 and the inverter 214. The inverter 214 includes CMOS inverters of a P-type MOS transistor 161 and an N-type MOS transistor 162.

The pixel 121 is different from the basic pixel circuit in FIG. 4 in that the pixel 121 further includes a switch 151, an inverter 152 and a transistor 153. The transistor 153 includes an N-type MOS transistor.

The switch 151 is inserted so as to be connected to the transistor 212 in series. Specifically, the switch 151 is disposed between the drain of the transistor 212 and a connection point of the cathode of the SPAD 211, the input terminal of the inverter 214 and the drain of the transistor 213. A gating signal GTNG for controlling the pixel 121 to be an active pixel or a non-active pixel is supplied to the switch 151. The switch 151 is switched on (connected) when a Hi gating signal GTNG is supplied and is switched off (open) when a Lo gating signal GTNG is supplied.

The inverter 152 is disposed before the transistor 213, and output of the inverter 152 is supplied to the gate of the transistor 213. The gating signal GTNG is supplied to input of the inverter 152. By this means, the transistor 213 is switched off when a Hi gating signal GTNG is supplied and is switched on when a Lo gating signal GTNG is supplied.

The transistor 153 is inserted so as to be connected to the transistor 213 in series. More specifically, the transistor 153 is set as a diode-connected transistor and is disposed between the source of the transistor 213 and the ground (GND). The drain of the transistor 153 is connected to the source of the transistor 213 and the gate of the transistor 153, and the source of the transistor 153 is connected to the ground. Further, bodies of the transistors 153 and 213 are also connected to the ground.

As the transistor 153, a low-threshold transistor (LVT transistor) for which a threshold voltage Vgs is lower than a threshold voltage Vth of (the MOS transistors 161 and 162 of) the inverter 214 is used. This can prevent a flow-through current from flowing at the inverter 214 because the transistor 153 operates prior to the inverter 214 (the transistor 153 is controlled to be switched on) in a case where the gating signal GTNG is changed from Hi to Lo and the pixel 121 is changed from an active pixel to a non-active pixel.

Figure 10:
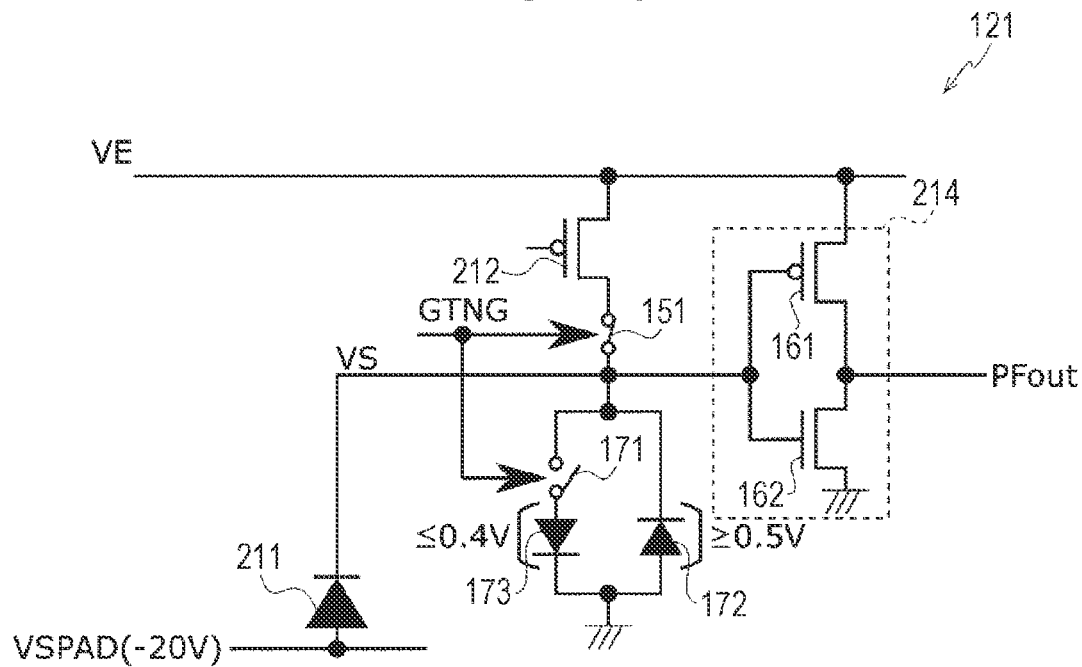
FIG. 10 is a view illustrating an equivalent circuit of the pixel in FIG. 9.

FIG. 10 illustrates an equivalent circuit of the pixel 121 in FIG. 9.

In FIG. 10, the transistor 213 in FIG. 9 is expressed with a switch 171 and a body diode 172. Further, the diode-connected transistor 153 in FIG. 9 is expressed as a diode 173. Here, a current flowing direction in the body diode 172 is opposite to a current flowing direction in the diode 173, and a forward voltage of the body diode 172 is equal to or higher than 0.5 V, while a forward voltage of the diode 173 is equal to or lower than 0.4 V. As illustrated in FIG. 9, bodies of both the transistors 213 and 153 are connected to the ground, so that the body diode 172 and the diode 173 are connected in parallel.

Operation of the pixel 121 in a case where the pixel 121 is set as an active pixel and a non-active pixel will be respectively described with reference to FIG. 11 and FIG. 12.

Note that it is assumed that the breakdown voltages VBD of the power supply VSPAD and the SPAD 211 at the pixel 121 are the same as that of the pixel 2002 through which a high current flows in a non-active pixel state in FIG. 6. In other words, it is assumed that the breakdown voltage VBD of the SPAD 211 of the pixel 121 is 19.5 V, and the power supply VSPAD is −20 V. It is assumed that the power supply voltage VE is also 3 V which is the same condition as that in FIG. 6.

Figure 11:
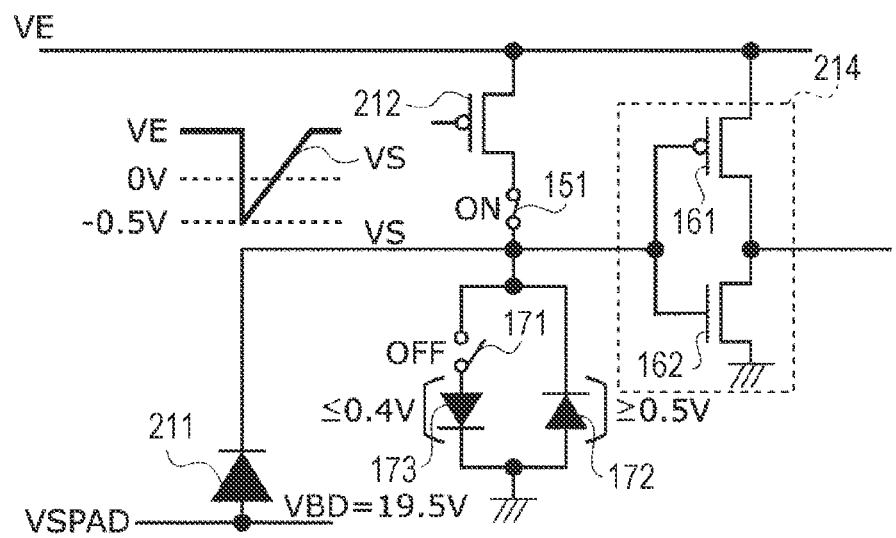
FIG. 11 is a view for explaining operation in a case where the pixel in FIG. 9 is set as an active pixel.

FIG. 11 illustrates an equivalent circuit in a case where the pixel 121 is set as an active pixel.

In a case where the pixel 121 is set as an active pixel, the gating signal GTNG is Hi, and thus, the switch 151 is switched on, and the switch 171 is switched off.

If a photon is incident on the SPAD 211, avalanche multiplication occurs, and a current flows to the SPAD 211. If the cathode voltage VS of the SPAD 211 becomes lower than −0.5 V, the cathode voltage VS of the SPAD 211 is lower than the breakdown voltage VBD of the SPAD 211 which is 19.5 V. Thus, as illustrated in FIG. 11, if the cathode voltage VS of the SPAD 211 becomes lower than −0.5 V, avalanche amplification stops, and operation of the pixel 121 transitions to recharge operation.

Figure 12:
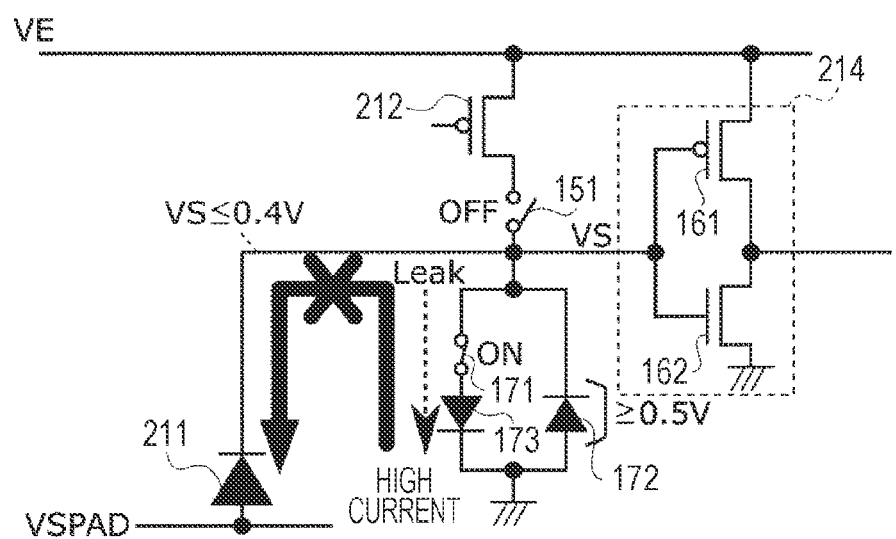
FIG. 12 is a view for explaining operation in a case where the pixel in FIG. 9 is set as a non-active pixel.

FIG. 12 illustrates an equivalent circuit in a case where the pixel 121 is set as a non-active pixel.

In a case where the pixel 121 is set as a non-active pixel, the gating signal GTNG is Lo, and thus, the switch 151 is switched off, and the switch 171 is switched on.

Also in a state where the switch 171 is switched on, the body diode 172 and the diode 173 (the diode-connected transistor 153) exist between the cathode voltage of the SPAD 211 and the ground.

The cathode voltage VS of the SPAD 211 is not directly connected to the ground by existence of the diode 173 between the cathode voltage VS of the SPAD 211 and the ground, so that a high current does not flow even if the cathode voltage VS of the SPAD 211 becomes negative. A voltage which is equal to or higher than the forward voltage of the body diode 172 of 0.5 V is required so that a high current flows as in the pixel 2002 in FIG. 6. This means that an anode potential of the SPAD 211, that is, the power supply VSPAD can be lowered by an amount corresponding to the forward voltage (in this example, 0.5 V) of the body diode 172.

As a result of the body diode 172 and the diode 173 being inserted between the cathode of the SPAD 211 and the ground, basically, the cathode of the SPAD 211 is floating.

However, by setting the transistor 153 as the low-threshold transistor (LVT transistor) which has a characteristic that a leak current is large, a leak current of the diode 173 pulls down the cathode voltage VS of the SPAD 211 to the ground. As a result, the cathode voltage VS of the SPAD 211 is not completely floating and converges to a GND potential.

A negative limit of the cathode voltage VS of the SPAD 211 is determined by the body diode 172, so that it is possible to protect a cathode connector element in a case where a surge (ESD) is applied to the SPAD 211, with characteristics of the body diode 172.

As described above, according to the configuration of the pixel 121 in which the diode-connected transistor 153 is provided between the source of the transistor 213 which performs gating and the ground (GND), it is possible to cause Vgs clamping without causing 0 V force when the pixel is set as a non-active pixel. A high current does not flow even if the cathode voltage VS of the SPAD 211 becomes lower than the breakdown voltage VBD, for example, becomes negative because 0 V force is not caused. Further, the power supply VSPAD can be lowered by an amount corresponding to the forward voltage (in this example, 0.5 V) of the body diode 172. Lowering the power supply VSPAD is equivalent to relatively increasing the excess bias, so that it is possible to improve pixel characteristics. In other words, it is possible to improve pixel characteristics while allowing variation in the breakdown voltage of the SPAD.

Further, by using a low-threshold transistor (LVT transistor) which has a characteristic that a leak current is large as the transistor 153, it is possible to provide an effect of pulling down the cathode voltage VS of the SPAD 211 to the ground.

<7. Use Example of Ranging System>

Figure 13:
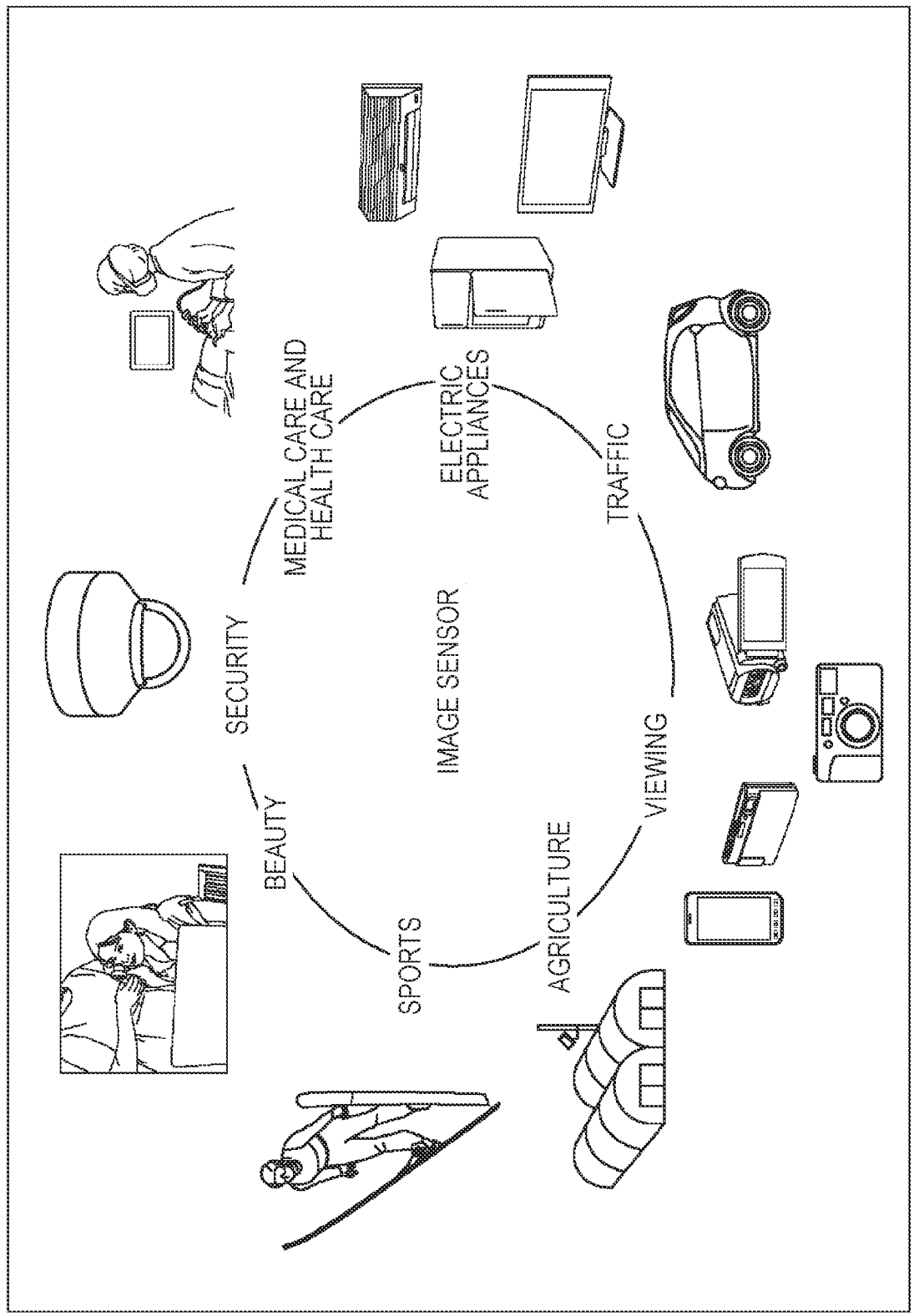
FIG. 13 is a view for explaining a use example of the ranging system.

FIG. 13 is a view illustrating a use example of the above-described ranging system 11.

The above-described ranging system 11 can be used in various cases of sensing light such as, for example, visible light, infrared light, ultraviolet light and X-ray as described below.

- an apparatus which captures an image to be provided for viewing, such as a digital camera and a mobile device with a camera function
- an apparatus to be provided for traffic, such as an in-vehicle sensor which captures images of portions in front of, behind, around, interior of, and the like, a monitoring camera which monitors traveling vehicles and roads, and a range sensor which measures a distance between vehicles, and the like for safe driving such as automatic stop, and to recognize a state of a driver
- an apparatus to be provided for electric appliances such as a TV, a refrigerator and an air conditioner to capture an image of gesture of a user to operate equipment in accordance with the gesture
- an apparatus to be provided for medical care and health care, such as an endoscope and an apparatus which captures images of vessels by receiving infrared light
- an apparatus to be provided for security, such as a security camera for crime prevention and a camera for personal authentication
- an apparatus to be provided for beauty care, such as a skin checker which captures an image of skin and a microscope which captures an image of scalp
- an apparatus to be provided for sports, such as an action camera and a wearable camera for sports use
- an apparatus to be provided for agriculture, such as a camera for monitoring states of fields and crops <8. Application Example to Mobile Object>

The technology (present technology) according to the present disclosure is applicable to a variety of products. For example, the technology according to the present disclosure is implemented as devices mounted on any type of mobile objects such as automobiles, electric vehicles, hybrid electric vehicles, motorcycles, bicycles, personal mobilities, airplanes, drones, ships, and robots.

Figure 14:
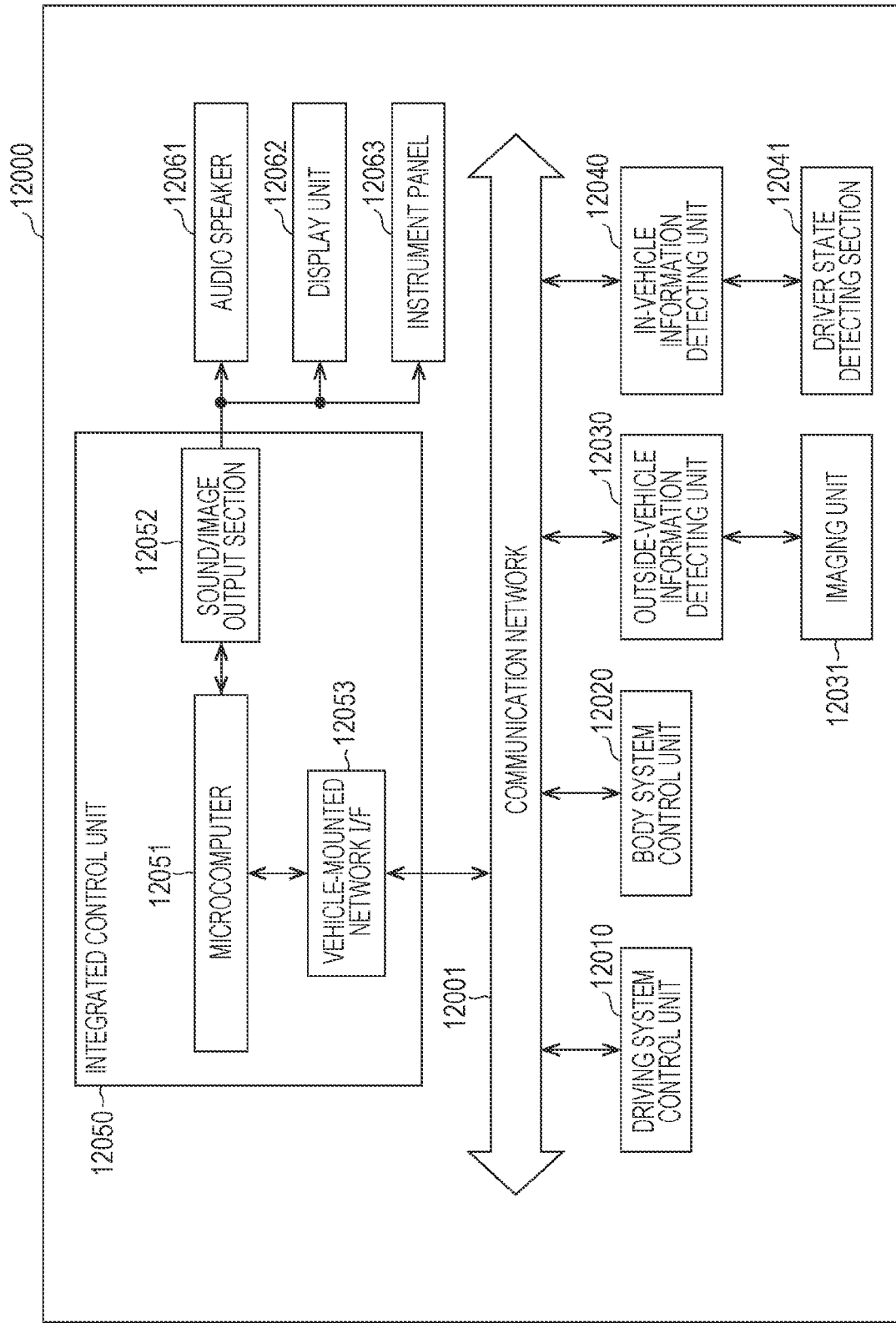
FIG. 14 is a block diagram illustrating an example of a schematic configuration of a vehicle control system.

FIG. 14 is a block diagram illustrating a schematic configuration example of a vehicle control system which is an example of a mobile object control system to which a technology according to the present disclosure is applicable.

The vehicle control system 12000 includes a plurality of electronic control units connected to each other via a communication network 12001. In the example illustrated in FIG. 14, the vehicle control system 12000 includes a driving system control unit 12010, a body system control unit 12020, an outside-vehicle information detecting unit 12030, an in-vehicle information detecting unit 12040, and an integrated control unit 12050. In addition, as functional configurations of the integrated control unit 12050, a microcomputer 12051, a sound/image output section 12052, and a vehicle-mounted network interface (I/F) 12053 are illustrated.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging unit 12031. The outside-vehicle information detecting unit 12030 makes the imaging unit 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging unit 12031 is an optical sensor that receives light, and which outputs an electric signal corresponding to a received light amount of the light. The imaging unit 12031 can output the electric signal as an image, or can output the electric signal as information about a measured distance. In addition, the light received by the imaging unit 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound or an image to an output device capable of visually or auditorily notifying an occupant of the vehicle or the outside of the vehicle of information. In the example of FIG. 14, an audio speaker 12061, a display unit 12062, and an instrument panel 12063 are exemplified as the output device. The display unit 12062 may, for example, include at least one of an on-board display or a head-up display.

Figure 15:
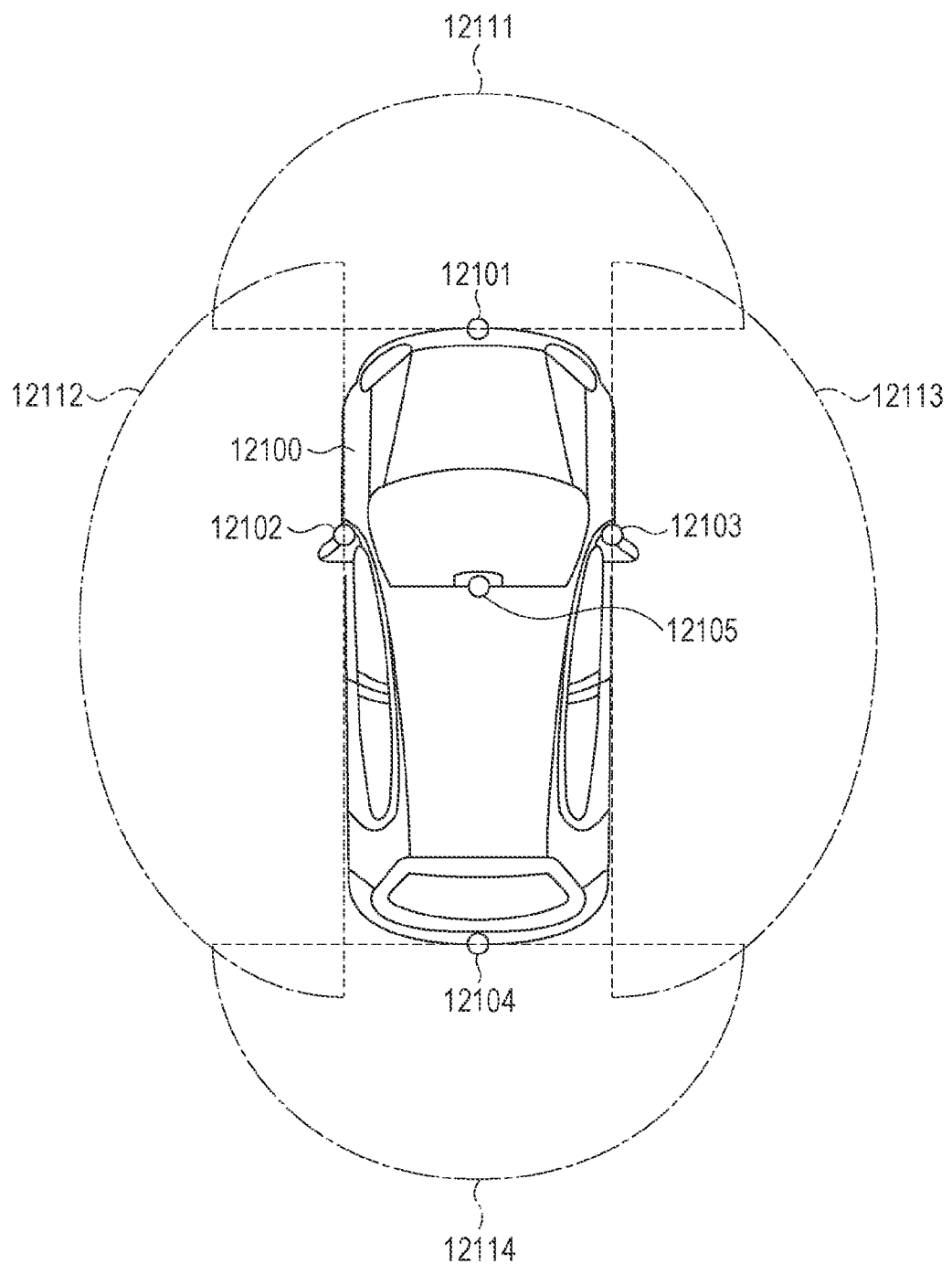
FIG. 15 is an explanatory diagram illustrating an example of installation positions of an outside-vehicle information detecting unit and an imaging unit.

FIG. 15 is a diagram illustrating an example of an installation position of the imaging unit 12031.

In FIG. 15, a vehicle 12100 includes imaging units 12101, 12102, 12103, 12104, and 12105 as the imaging unit 12031.

Imaging units 12101, 12102, 12103, 12104, and 12105 are positioned, for example, at the front nose, a side mirror, the rear bumper, the back door, and the upper part, or the like, of the windshield in the vehicle compartment of the vehicle 12100. The imaging unit 12101 provided to the front nose and the imaging unit 12105 provided to the upper part of the windshield in the vehicle compartment obtain mainly an image of the front of the vehicle 12100. The imaging units 12102 and 12103 attached to the side mirrors obtain mainly images of the areas on the sides of the vehicle 12100. The imaging unit 12104 provided to the rear bumper or the back door obtains mainly an image of the rear of the vehicle 12100. The image of the front of the vehicle obtained by the imaging units 12101 and 12105 is used mainly to detect a preceding vehicle, a pedestrian, an obstacle, a signal, a traffic sign, a lane, or the like.

Additionally, FIG. 15 illustrates an example of the imaging ranges of the imaging units 12101 to 12104. An imaging range 12111 represents the imaging range of the imaging unit 12101 provided to the front nose. Imaging ranges 12112 and 12113 respectively represent the imaging ranges of the imaging units 12102 and 12103 provided to the side mirrors. An imaging range 12114 represents the imaging range of the imaging unit 12104 provided to the rear bumper or the back door. A bird's-eye image of the vehicle 12100 as viewed from above is obtained by superimposing image data imaged by the imaging units 12101 to 12104, for example.

At least one of the imaging units 12101 to 12104 may have a function of obtaining distance information. For example, at least one of the imaging units 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging units 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, etc., and other three-dimensional objects on the basis of the distance information obtained from the imaging units 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display unit 12062, and performs forced deceleration or avoidance steering via the driving system control unit 12010. The microcomputer 12051 can thereby assist in driving to avoid collision.

At least one of the imaging units 12101 to 12104 may be an infrared camera that detects infrared rays. The microcomputer 12051 can, for example, recognize a pedestrian by determining whether or not there is a pedestrian in imaged images of the imaging units 12101 to 12104. Such recognition of a pedestrian is, for example, performed by a procedure of extracting characteristic points in the imaged images of the imaging units 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging units 12101 to 12104, and thus recognizes the pedestrian, the sound/image output section 12052 controls the display unit 12062 so that a square contour line for emphasis is displayed so as to be superimposed on the recognized pedestrian. Further, the sound/image output section 12052 may also control the display unit 12062 so that an icon or the like representing the pedestrian is displayed at a desired position.

In the above, an example of the vehicle control system to which the technology related to the present disclosure can be applied is described. The technology according to the present disclosure can be applied to the imaging unit 12031 or the like within the above-described configuration. Specifically, for example, the ranging system 11 illustrated in FIG. 1 can be applied to the Imaging unit 12031. The Imaging unit 12031 is a LIDAR, for example, and is used for detecting a distance to an object around the vehicle 12100 and the object. By applying the technology of the present disclosure to the imaging unit 12031, the accuracy of detecting the distance to the object around the vehicle 12100 and the object will be improved. As a result, for example, it becomes possible to issue a warning of collision of the vehicle at an appropriate timing so as to prevent a traffic accident.

Further, in the present specification, a system has the meaning of a set of a plurality of structural elements (such as an apparatus or a module (part)), and does not take into account whether or not all the structural elements are in the same casing. Therefore, the system may be either a plurality of apparatuses stored in separate casings and connected through a network, or an apparatus in which a plurality of modules is stored within a single casing.

Further, an embodiment of the present technology is not limited to the embodiments described above, and various changes and modifications may be made without departing from the scope of the present technology.

Note that the effects described in the present specification are not limiting but are merely examples, and there may be additional effects other than the description in the present specification.

Further, the present technology may also be configured as below.

(1)

A light receiving element including:
a pixel array in which a plurality of pixels is arranged in a matrix; and
a pixel driving unit configured to control respective pixels of the pixel array to be active pixels or non-active pixels,
in which the pixel includes:
an SPAD;
a resistance component connected to the SPAD in series;
an output unit configured to output a detection signal indicating incidence of a photon on the SPAD;
a first transistor which is switched on or off in accordance with control of the pixels to be the active pixels or the non-active pixels; and
a second transistor connected to the first transistor in series.

(2)

The light receiving element according to (1),
in which the second transistor is a diode-connected transistor.

(3)

The light receiving element according to (2),
in which the second transistor is connected to a body diode of the first transistor in parallel.

(4)

The light receiving element according to (3),
in which a current flowing direction in the second transistor is opposite to a current flowing direction in the body diode.

(5)

The light receiving element according to any one of (1) to (4),
in which the output unit includes a CMOS inverter, and a threshold voltage of the second transistor is lower than a threshold voltage of the CMOS inverter.

(6)

A ranging system including:
an illumination apparatus configured to radiate irradiation light; and
a light receiving element configured to receive reflected light of the irradiation light,
in which the light receiving element includes:
a pixel array in which a plurality of pixels is arranged in a matrix; and
a pixel driving unit configured to control respective pixels of the pixel array to be active pixels or non-active pixels, and the pixel includes:
an SPAD;
a resistance component connected to the SPAD in series;
an output unit configured to output a detection signal indicating incidence of a photon on the SPAD;
a first transistor which is switched on or off in accordance with control of the pixels to be the active pixels or the non-active pixels; and
a second transistor connected to the first transistor in series.

REFERENCE SIGNS LIST

11 Ranging system
21 Illumination apparatus
22 Imaging apparatus
31 Illumination control unit
32 Light source
41 Imaging unit
42 Control unit
52 Light receiving element
53 Signal processing circuit
111 Pixel driving unit
112 Pixel array
121 Pixel
151 Switch
152 Inverter
153 Transistor
161, 162 MOS transistor
171 Switch
172 Body diode
173 Diode
211 SPAD
212, 213 Transistor
214 Inverter

The invention claimed is:
1. A light receiving element, comprising:
a pixel array in which a plurality of pixels is arranged in a matrix; and
a pixel driving unit configured to control respective pixels of the pixel array to be active pixels or non-active pixels,
wherein the pixel includes:
a single photon avalanche diode (SPAD);
a resistance component connected to the SPAD in series;
an output unit configured to output a detection signal indicating incidence of a photon on the SPAD;
a first transistor which is switched on or off in accordance with control of the pixels to be the active pixels or the non-active pixels; and
a second transistor connected to the first transistor in series,
wherein the second transistor is a diode-connected transistor.
2. The light receiving element according to claim 1,
wherein the second transistor is connected to a body diode of the first transistor in parallel.
3. The light receiving element according to claim 2,
wherein a current flowing direction in the second transistor is opposite to a current flowing direction in the body diode.
4. A light receiving element, comprising:
a pixel array in which a plurality of pixels is arranged in a matrix; and
a pixel driving unit configured to control respective pixels of the pixel array to be active pixels or non-active pixels,
wherein the pixel includes:
a single photon avalanche diode (SPAD);
a resistance component connected to the SPAD in series;
an output unit configured to output a detection signal indicating incidence of a photon on the SPAD;
a first transistor which is switched on or off in accordance with control of the pixels to be the active pixels or the non-active pixels; and
a second transistor connected to the first transistor in series,
wherein the output unit includes a CMOS inverter, and
a threshold voltage of the second transistor is lower than a threshold voltage of the CMOS inverter.
5. A ranging system, comprising:
an illumination apparatus configured to radiate irradiation light; and
a light receiving element configured to receive reflected light of the irradiation light,
wherein the light receiving element includes:
a pixel array in which a plurality of pixels is arranged in a matrix; and
a pixel driving unit configured to control respective pixels of the pixel array to be active pixels or non-active pixels, and
the pixel includes:
a single photon avalanche diode (SPAD);
a resistance component connected to the SPAD in series;
an output unit configured to output a detection signal indicating incidence of a photon on the SPAD;
a first transistor which is switched on or off in accordance with control of the pixels to be the active pixels or the non-active pixels; and
a second transistor connected to the first transistor in series,
wherein the second transistor is a diode-connected transistor.

* * * * *